United States Patent [19]
Rust et al.

[11] Patent Number: 5,442,664
[45] Date of Patent: Aug. 15, 1995

[54] DIGITALLY PHASE MODULATED CLOCK INHIBITING REDUCED RF EMISSIONS

[75] Inventors: Robert Rust; Phillip R. Luque, both of Boise, Id.; Derek L. Knee, Sunnyvale, Calif.

[73] Assignee: Hewlett-Packard Company, Palo Alto, Calif.

[21] Appl. No.: 171,314

[22] Filed: Dec. 20, 1993

[51] Int. Cl.6 .................... H03K 7/06; H03K 9/06
[52] U.S. Cl. ............................ 375/371; 370/108
[58] Field of Search .............. 375/110, 111, 118, 119; 370/100.1, 108; 328/72, 75, 155

[56] References Cited

U.S. PATENT DOCUMENTS

| | | | |
|---|---|---|---|
| 4,513,427 | 4/1985 | Borriello et al. | 370/108 |
| 5,022,056 | 6/1991 | Henderson et al. | 375/119 |

*Primary Examiner*—Stephen Chin
*Assistant Examiner*—Don N. Vo

[57] ABSTRACT

A modulator for a clock pulse generator receives clock pulses from a clock pulse source, which clock pulses exhibit a reference phase. Delay circuitry is connected to the clock pulse source and includes n tap connections, each connection providing a clock pulse that is delayed by a different phase delay from the reference phase. A multiplexer is connected to each of the n tap connections and provides an output manifesting the clock pulses. A selector circuit controls the multiplexer to sequentially connect any sequence of different ones of the n tap connections to the multiplexer's output, whereby the output manifests a series of clock pulses which have different phase displacements from the reference phase.

8 Claims, 1 Drawing Sheet

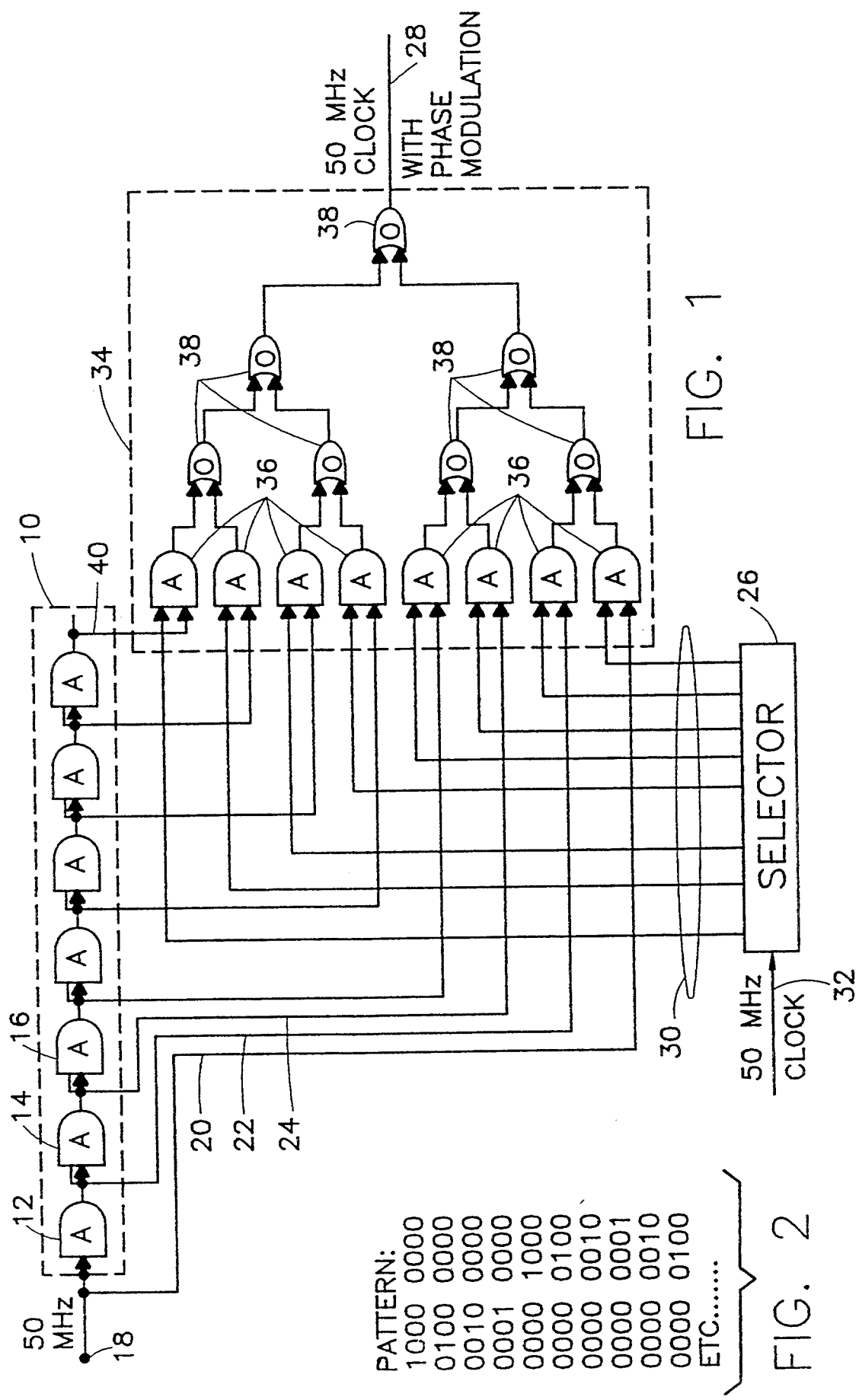

DIGITALLY PHASE MODULATED CLOCK INHIBITING REDUCED RF EMISSIONS

FIELD OF THE INVENTION

This invention relates to digital clock frequency generating circuits and, more particularly, to a modulator for modulating the output of a clock generator in such a manner as to cause a reduction in emitted radio frequency interference.

BACKGROUND OF THE INVENTION

Radio frequency interference (RFI) is a known problem in digital circuitry and efforts are continually being addressed to its reduction. RFI is known to be generated by higher harmonics of the basic clock frequency. In such case, the clock frequency energy is distributed and segregated into specific, narrow bands about each harmonic frequency. It is known that RFI can be reduced by causing the energy in the higher harmonics of the clock frequency to be more evenly distributed about the side bands adjoining the harmonic frequencies. Such distribution can be achieved by varying the phase of succeeding clock pulses so as to assure a continued modulation thereof and a resultant distribution of harmonic energy into adjacent sidebands.

Voltage controlled oscillators have been utilized to generate master clock signals. The prior art has attempted to reduce the RFI of such clock signals by modulating the voltage controlled oscillator so as to cause a variation in the system clock frequency. This modulation causes a spreading of the clock signal energy across the spectrum, with the extent of the sidebands defined by the modulating frequency. However, since the voltage controlled oscillator is not locked to a specific reference, its output center frequency tends to wander as a result temperature and other environmental affects. To prevent such frequency variation, voltage controlled oscillators have been locked to a crystal controlled frequency source; however, this prevented the use of an RFI reduction technique.

Phase locked loops have been employed to accomplish phase modulation of the output of a voltage controlled oscillator. Such phase locked loops generally require the use of external pins on a semiconductor chip to enable connection to circuit elements that are not integrated into the chip. In certain types of digital logic, phase locked loop circuits are not available (e.g. circuits configured in gate array formations). Further, excess pins are often not available in such circuit configurations.

Accordingly, it is an object of this invention to provide an improved digital logic modulator which enables phase variation of a clock frequency.

It is another object of this invention to provide a modulator for a clock frequency source, which modulator is entirely implemented in digital logic.

SUMMARY OF THE INVENTION

A modulator for a clock pulse generator receives clock pulses from a clock pulse source, which clock pulses exhibit a reference phase. Delay circuitry is connected to the clock pulse source and includes n tap connections, each connection providing a clock pulse that is delayed by a different phase delay from the reference phase. A multiplexer is connected to each of the n tap connections and provides an output manifesting the clock pulses. A selector circuit controls the multiplexer to sequentially connect any sequence of different ones of the n tap connections to the multiplexer's output, whereby the output manifests a series of clock pulses which have different phase displacements from the reference phase.

DESCRIPTION OF THE DRAWINGS

FIG. 1 is a diagram of a clock phase modulator constructed in accordance with the invention;

FIG. 2 is a chart showing logical inputs to a selector in the circuit of FIG. 1, which logical outputs control the phase output of the circuit.

DETAILED DESCRIPTION OF THE INVENTION

The clock frequency modulator circuit diagram is shown in FIG. 1 and comprises three main components. The first component is a delay chain 10 of logic gates 12, 14, 16, etc. Delay chain 10 is implemented by appropriate digital logic circuits such as AND gates, which gates are connected serially to introduce additive delays into delay chain 10. Each connection between succeeding gates (e.g. 12, 14, ) is a "tap" for delay chain 10.

As is known, each gate circuit 12, 14, etc. has an inherent delay such that a clock pulse applied at input 18 will propagate through line 20 with no delay, through line 22 with one gate delay, through line 24 with two gate delays, etc. To employ AND gates as the delay elements, plural inputs to each AND gate are tied together and serve as a single input to the AND gate.

The second component of the circuit is a selector module 26 that functions to select one of the taps in delay chain 10 to be connected to output 28 of the modulator. Selector module 26 selectively energizes one of its outputs 30 in accordance with either a predetermined or a random pattern. One of output lines 30 is rendered active by selector module 26 upon the occurrence of each clock input (applied via input line 32). Selector module 26 may be configured as an up/down counter; a logical tree which converts a three input binary value from a controlling processor (not shown) to a one of eight output on lines 30; a circuit that includes a random number generator which produces a one of eight output of lines 30 in accordance with a random value calculation, etc. Assuming that selector module 26 is an up/down counter, the pattern of outputs on lines 30 will appear as shown in FIG. 2, with each one of lines 30 being made active in sequence, initially in a first direction and then in a second, reverse direction.

The third component of the invention is a multiplexer circuit 34 that is comprised of a plurality of AND gates 36 and connected OR gates 38. Multiplexer circuit 34 receives an input from selector module 26 (via lines 30) and in accordance therewith connects a particular tap in delay chain 10 to output line 28. Multiplexer circuit 34 is constructed as a balanced multiplexer so that a delay path from any tap in delay chain 10 to clock signal output 28 is equal. This assures that the only difference in phase between succeeding clock pulses on output line 28 is determined by the delay to a particular selected tap.

In operation, selector module 26 renders active one of its output lines 30 upon the occurrence of each clock input applied via line 32. Depending upon which output line 30 is rendered active, one of AND gates 36 is partially selected. The partially selected AND gate 36 will be fully selected when the same clock pulse applied to input terminal 18 arrives at a tap that is connected to the AND gate. At that point, the clock pulse will have been delayed by n AND gates and the fully selected AND gate 36 provides a pulse output which propagates through OR circuits 38 to output line 28. No other AND gate is fully selected for the duration of that clock pulse. Upon the occurrence of a next clock pulse, selector module 26 renders active another one of lines 30 and the process repeats.

By causing selector module 26 to assure that a different output line 30 is rendered active upon each clock cycle, the clock pulses appearing at output line 28 are assured of having different phase relations with the reference phase of the originally applied clock signal. Such a phase variation results in a spreading of the energy at the higher harmonics of the clock frequency.

As an example, assume that each AND gate in delay chain 10 manifests a delay of 300 picoseconds. Because delay chain 10 has seven AND gates, the total delay therethrough, from input line 20 to output tap 40, is 2.1 nanoseconds. Since a 50 MHz signal has a clock period of 20 nanoseconds, 2.1 nanoseconds is approximately 10 percent thereof and thus delay chain 10 manifests a total phase delay of approximately 36 degrees (at the fundamental frequency). At 50 MHz, this equates to a plus/- minus 18 degree change in phase. By contrast, at the 10th harmonic (500 MHz), the phase change is $10 \times 18$ degrees or 180 degrees. This clearly evidences the substantial energy spread that is achieved by the circuit of FIG. 1 at the higher harmonics which contribute most heavily to the RFI.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A clock pulse generator for producing phase displaced clock pulses, said clock pulse generator comprising:
   a clock pulse source for producing clock pulses exhibiting a reference phase;
   delay means connected to said clock pulse source and including n connections, each connection providing a clock pulse that is delayed by a different phase delay from said reference phase;
   multiplexer means connected to each of said n connections and providing an output manifesting a series of clock pulses, each clock pulse of said series having a different phase displacement from said reference phase than other clock pulses of said series; and
   selector means for controlling said multiplexer means to sequentially connect a sequence of different ones of said n connections to said output, whereby said output enabled to manifest said series of clock pulses, each of which has a different phase displacement from said reference phase.

2. The clock pulse generator as recited in claim 1 wherein said selector means controls said multiplexer means to connect, once each clock pulse, a different one of said n connections to said output.

3. A clock pulse generator as recited in claim 1, wherein said selector means comprises:
   circuit means having a plurality of outputs connected to said multiplexer means, said circuit means coupled to said clock pulse source and providing a different control output state on said outputs to said multiplexer means upon each clock pulse occurrence, each said control output state causing said multiplexer means to interconnect a different one of said n connections to said output from said multiplexer means.

4. The clock pulse generator as recited in claim 3, wherein said control output states vary in a regular and sequential order across said plurality of outputs of said circuit means.

5. A clock pulse generator as recited in claim 3 wherein said control output states occur in a random order across said plurality of outputs of said circuit means.

6. The clock pulse generator as recited in claim 1 wherein said delay means comprises a series of connected logic gates, said n connections occurring at connection points between said logic gates.

7. A clock pulse generator as recited in claim 6 wherein said logic gates comprise a plurality of series connected AND gates.

8. A clock pulse generator as recited in claim 3 wherein said multiplexer means comprises:
   a plurality of input AND gates, each said input AND gate having an input connected to one of said n connections in said delay means and another input connected to one of said outputs from said selector means; and
   logic means connecting outputs of all said AND gates to said output.

* * * * *